(12) United States Patent
Grasa

(10) Patent No.: US 7,943,018 B2
(45) Date of Patent: May 17, 2011

(54) APPARATUS FOR TREATING FLAT BRITTLE SUBSTRATES

(75) Inventor: Ivo Grasa, Gaeufelden (DE)

(73) Assignee: Hoellmueller Maschinenbau GmbH, Herrenberg (DE)

( * ) Notice: Subject to any disclaimer, the term of this patent is extended or adjusted under 35 U.S.C. 154(b) by 882 days.

(21) Appl. No.: 11/974,913

(22) Filed: Oct. 16, 2007

(65) Prior Publication Data

US 2008/0121519 A1 May 29, 2008

(30) Foreign Application Priority Data

Oct. 17, 2006 (DE) .................... 10 2006 049 488

(51) Int. Cl.
*C25D 17/00* (2006.01)

(52) U.S. Cl. ....................................... 204/198

(58) Field of Classification Search .................. 204/119, 204/200, 227, 198; 118/620
See application file for complete search history.

(56) References Cited

U.S. PATENT DOCUMENTS

| 3,342,573 | A | * | 9/1967 | Fredley et al. ................ 65/25.2 |
| 4,213,523 | A | * | 7/1980 | Frost et al. ...................... 193/37 |
| 5,529,081 | A | | 6/1996 | Kappler |
| 6,110,282 | A | * | 8/2000 | Tateyama et al. ............. 118/712 |
| 6,238,529 | B1 | * | 5/2001 | Geissler et al. ............... 204/202 |
| 6,821,345 | B2 | * | 11/2004 | Obermark ...................... 118/227 |
| 6,971,505 | B2 | | 12/2005 | Gutekunst |
| 2003/0194309 | A1 | * | 10/2003 | Gutekunst ..................... 414/935 |

FOREIGN PATENT DOCUMENTS

| DE | 10 2006 033 354 | 1/2008 |
| GB | 977449 | 12/1964 |
| WO | WO 03/086914 | 10/2003 |
| WO | WO 2005/093788 | 10/2005 |

* cited by examiner

*Primary Examiner* — Luan V Van
(74) *Attorney, Agent, or Firm* — Factor & Lake, Ltd.

(57) ABSTRACT

An apparatus for treating flat, brittle substrates is described, in which apparatus the substrates are acted upon in a treatment chamber by a treatment liquid. For this purpose they are guided by a transport device so as to pass horizontally through the treatment chamber. Lateral guide devices which comprise cylindrical, rotatably mounted lateral guide rollers ensure that the substrates are conveyed in an advantageous manner in a conveying direction.

16 Claims, 3 Drawing Sheets

APPARATUS FOR TREATING FLAT BRITTLE SUBSTRATES

RELATED APPLICATIONS

This application claims the benefit of German Patent Application No. 10 2006 049 488.1, filed Oct. 17, 2006; the contents of which all are incorporated herein by reference.

TECHNICAL FIELD

The invention relates to an apparatus for treating flat, brittle substrates, in particular for the semiconductor and solar industry, with
a) a treatment chamber, in which the substrates can be acted upon by a treatment liquid;
b) a transport device, by means of which the substrates can be guided so as to pass horizontally through the treatment chamber;
c) at least one lateral guide device which acts on outer edges of the substrates which point away from one another and are oriented substantially parallel to a conveying direction.

BACKGROUND OF THE INVENTION

Very flat substrates such as, for example, silicon slices (wafers), silicon sheets and glass plates which must be subjected to the most varied types of wet processes are frequently found in the semiconductor and solar industry. These processes are, for example, chemical and electrochemical treatments, rinsing and drying processes. The treatment liquid can be applied both in a spraying and in an immersion method. Substrates of the above-mentioned type are highly susceptible to fracturing and must therefore be conveyed very carefully through the treatment chamber(s). A transport device which comprises a plurality of transport rollers is provided for this purpose. The transport rollers are fitted in a rotationally rigid manner to spindles, which are in some cases driven and are oriented substantially horizontally, and enable the substrates to be conveyed in a conveying direction.

Also provided is a lateral guide device which serves to orient the preferably rectangular substrates in the conveying direction predetermined by the transport device. The substrates are typically oriented so that outer edges of the substrates which point away from one another are oriented substantially parallel to the conveying direction. The outer edges, which come into active contact with the lateral guide device, are usually the longest outer edges of the substrates.

Lateral guide rollers which are in each case disposed opposite one another and shaped like a conical section are provided in an apparatus which is known from DE 10 2006 033 354 for treating flat, brittle substrates, the purpose of which rollers is to orient the substrates in the conveying direction. The lateral guide rollers are fitted in a rotationally rigid manner to rotating spindles which are oriented substantially horizontally. In the normal case the substrates come into contact with the circular front face of the lateral guide rollers, shaped like a conical section, during transport in the conveying direction. This results in a superimposition of a translatory and rotational relative movement between the substrates which are to be conveyed and the lateral guide rollers, with the possibility of the occurrence of frictional forces which may be oriented at an angle to the conveying direction and therefore may give rise to the risk of damage to the outer edges of the substrates.

The present invention is directed to addressing these and other matters.

SUMMARY OF THE INVENTION

An object of the present invention is to provide an apparatus of the type initially mentioned in which careful lateral guidance of the substrates is possible with simple means.

This object may be achieved according to the invention in that the lateral guide device comprises cylindrical, rotatably mounted guide rollers.

The invention is based on the knowledge that fractures or chipping at the outer edges of the substrates are/is frequently caused by the superimposition of several relative movements between the outer edges of the substrates and the known lateral guide rollers. There is in addition the possibility of damage to the substrate in the event of fluctuations of a liquid level of the treatment liquid in the treatment chamber, these entailing an upward displacement of the substrate. It may as a result reach the surface, shaped like a conical section, of the lateral guide rollers with the outer edge. Damage may occur upon the substrate subsequently sliding down onto the transport rollers provided to convey the substrates. On the one hand a pure rolling movement between the outer edges of the substrates and the surface of the rotatably mounted lateral guide rollers is produced by using cylindrical lateral guide rollers. Any frictional forces occurring are in this case oriented parallel to the conveying direction. Moreover, in the event of the substrate lifting off the transport rollers, the cylindrical lateral guide rollers prevent additional force components from occurring in the vertical direction due to the substrate lying, for example, against surfaces of lateral guide rollers shaped like a conical section.

According to one configuration of the invention, axes of rotation of the lateral guide rollers are oriented at least substantially normal to a conveying plane determined by transport rollers. The substrates lie on transport rollers which determine a conveying plane preferably oriented substantially parallel to a liquid level of the treatment liquid and transport the substrates in the conveying direction. If the axes of rotation of the lateral guide rollers are thus oriented, a pure rolling movement between the outer edges of the substrates and the lateral guide rollers takes place with low rolling friction.

In a further configuration of the invention the lateral guide rollers are fitted in a rotatably mobile manner to journals by means of rolling contact bearings, in particular ball bearings. By using rolling contact bearings, in particular ball bearings, it is possible to achieve particularly advantageous, very low rolling friction between the lateral guide rollers and the journals provided in a stationary manner at the transport device. It is therefore also possible to maintain a low resistance to movement for the substrates, which is a result of the rolling movement with the lateral guide rollers.

In a further configuration of the invention the rolling contact bearings are composed of at least one plastics material which is resistant, in particular inert, with respect to the treatment liquid. By using plastics material for the rolling contact bearings, in particular for the rolling bodies and any outer and/or inner races of the ball bearings, the rolling contact bearings can be inexpensively produced and advantageous compatibility with the typically aggressive treatment liquid achieved. The use of plastics materials which are inert with respect to the treatment liquid is of particular advantage. Plastics materials of this kind are neither attacked by the treatment liquid nor lead to undesired reactions with the treatment liquid. Polytetrafluoroethylene (PTFE) and polyetheretherketone (PEEK) in particular are possible suitable plastics materials.

In a further configuration of the invention the lateral guide device extends completely over an entire transport path of the substrates in the treatment chamber, and/or the guide rollers are in each case disposed in pairs opposite one another in rows along the conveying direction. As a result of the lateral guide device extending over the entire transport path of the substrates, it is possible to guarantee that the substrates are adequately guided and do not tilt in the treatment chamber, so that damage can be avoided. An arrangement in pairs opposite one another of the lateral guide rollers in rows along the conveying direction enables a symmetrical application of force to the substrates to be guaranteed, so that tipping or tilting of the substrates can be avoided.

In a further configuration of the invention at least one counterholding device is provided which acts on the upward pointing side of the substrates in order to prevent the latter from lifting off the transport device.

The known horizontal continuous electroplating plant, as are used for printed circuit board electroplating, cannot be used for the application in the case of the substrates discussed here. In contrast to printed circuit boards, substrates of the type initially mentioned are only of low elasticity, so that there is a considerable risk of fracture even when small forces are applied. In order nevertheless to be able to guarantee that the substrates can be transported through the treatment chamber in an orderly manner, the apparatus for treating the flat, brittle substrates comprises a counterholding device. This prevents the substrates from lifting off the transport device due to the buoyancy in the treatment liquid.

In a further configuration of the invention the substrates are guided through the treatment chamber in a plurality of tracks which are parallel to one another. A large number of substrates can as a result be guided through the treatment chamber at an advantageously adapted, in particular low, speed. In order to be able to guide an identical or similar number of pieces per unit of time through the treatment chamber in the case of single-track guidance of the substrates without shortening a treatment period for the substrates, a higher conveying speed should be selected and the treatment chamber should be of a longer construction. A gentle conveying speed for the substrates and a compact treatment chamber size can thus be achieved through parallel guidance in several tracks.

These and other objects and advantages will be made apparent from the following brief description of the drawings and the detailed description of the invention.

DETAILED DESCRIPTION OF THE PRESENT INVENTION

Figure 1:
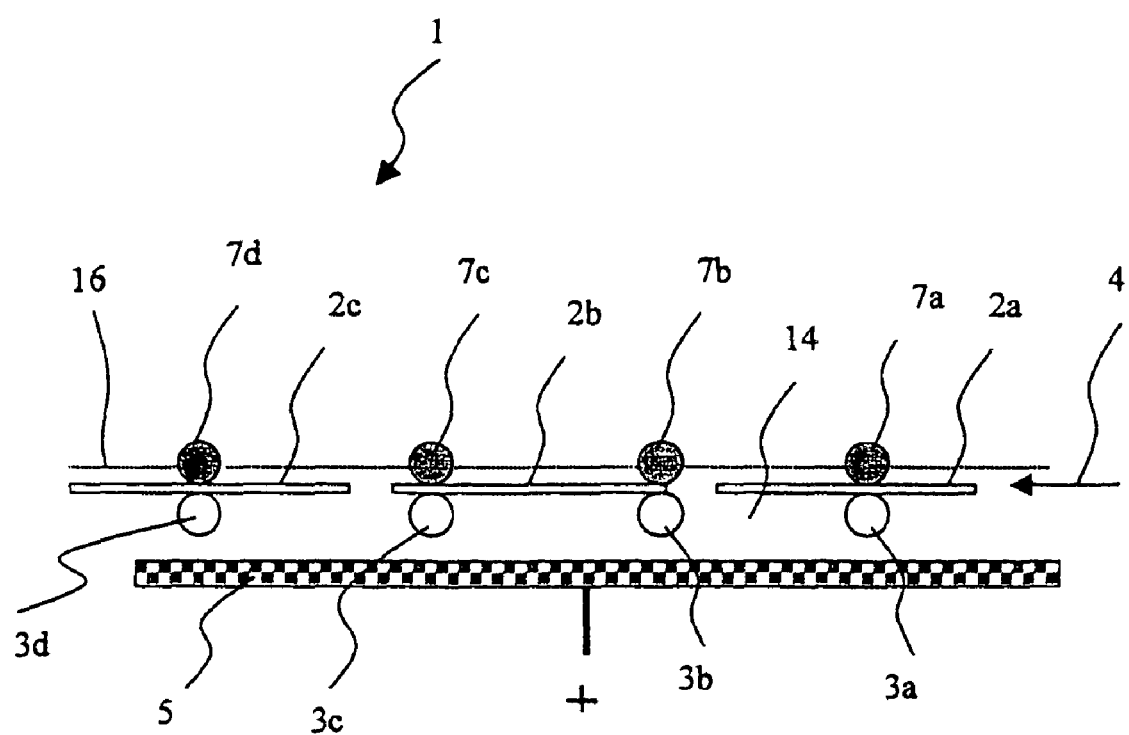
FIG. 1 shows in a schematic side view an apparatus for the electroplating reinforcement of metallic conductor tracks applied to a silicon substrate.

While this invention is susceptible of embodiment in many different forms, there is shown in the drawings and will herein be described in detail one or more embodiments with the understanding that the present disclosure is to be considered as an exemplification of the principles of the invention and is not intended to limit the invention to the embodiments illustrated.

An application from the solar industry is described in the following as an example of a "treatment" in the sense which is of interest here.

In order to produce solar cells, silicon sheets of a thickness of approximately 0.2 mm are used, these comprising vapour-deposited or screen-printed thin metallic electrical conductor tracks on the side which subsequently becomes the "solar active" side. These tracks must be reinforced by electroplating to a layer thickness of 1-20 micrometers. The reinforcing material may be copper, tin, silver or gold. The contact faces which are required for this purpose are located on the opposite side of the substrate, these being, for example, in the form of contact strips and/or contact windows which are electrically connected to the vapour-deposited or screen-printed electrical conductor tracks on the "solar active" side.

FIG. 1 shows an apparatus which is marked as a whole by the reference character 1 and by means of which the vapour-deposited conductor tracks of silicon substrates of this kind can be reinforced. Three silicon substrates are represented and marked by the reference characters 2a, 2b and 2c in FIG. 1. These silicon substrates 2a, 2b, 2c are guided through an electroplating bath liquid 14 by means of a roller transport system comprising a plurality of driven rollers 3a, 3b, 3c, 3d. The conveying direction is indicated by the arrow 4. The level 16 of the electroplating bath liquid 14 lies just, 0.1 to 10 millimeters, above the top side of the silicon substrates 2a, 2b, 2c. The silicon substrates 2a, 2b, 2c therefore dip completely into the bath liquid 14 upon passing through the electroplating bath. In this case the "solar active" side points downwards, while the side of the silicon substrates 2a, 2b, 2c which comprises the contact faces points upwards.

A plate-shaped anode 5, which is connected to the positive pole of an electroplating current source, which is not represented, extends along and below the path of movement of the silicon substrates 2a, 2b, 2c. If the reinforcing metal is copper, tin or silver, soluble, self-consuming anodes 5 can be used. However if the bath in question is a gold bath, the work is carried out with insoluble anodes 5.

Mating rollers 7a, 7b, 7c, 7d are disposed on the sides of the silicon substrates 2a, 2b, 2c which lie opposite the transport rollers 3a, 3b, 3c, 3d. These mating rollers 7a, 7b, 7c, 7d serve two functions: On the one hand they represent the guide devices which push the silicon substrates 2a, 2b, 2c gently downwards and thus hold them below the level 16 of the bath liquid 12. On the other hand the mating rollers 7a, 7b, 7c serve as contact devices by means of which the contact faces of the silicon substrates 2a, 2b, 2c and therefore the conductor tracks which are vapour-deposited or screen-printed on the underside can be electrically connected to the negative pole of the electroplating current source, which is not represented, in a manner which is not of further interest.

Figure 2:
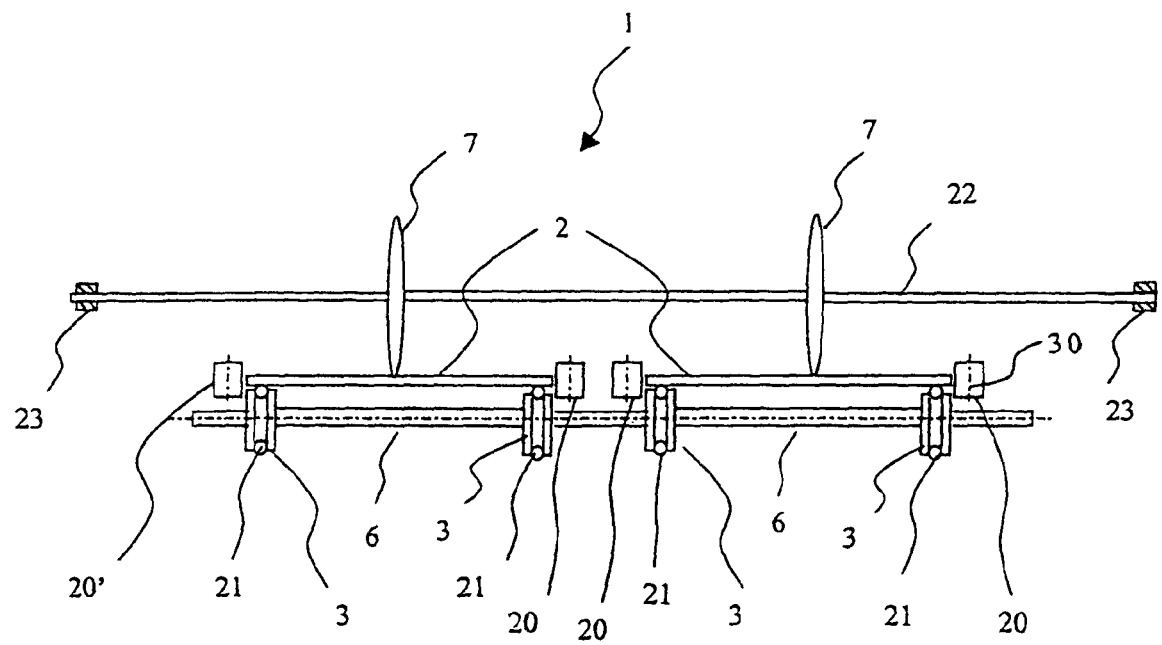
FIG. 2 shows a vertical section through an apparatus according to FIG. 1, provided with cylindrical lateral guide rollers and with a first embodiment of a counterholding device, perpendicularly to the drawing plane of FIG. 1.
Figure 3:
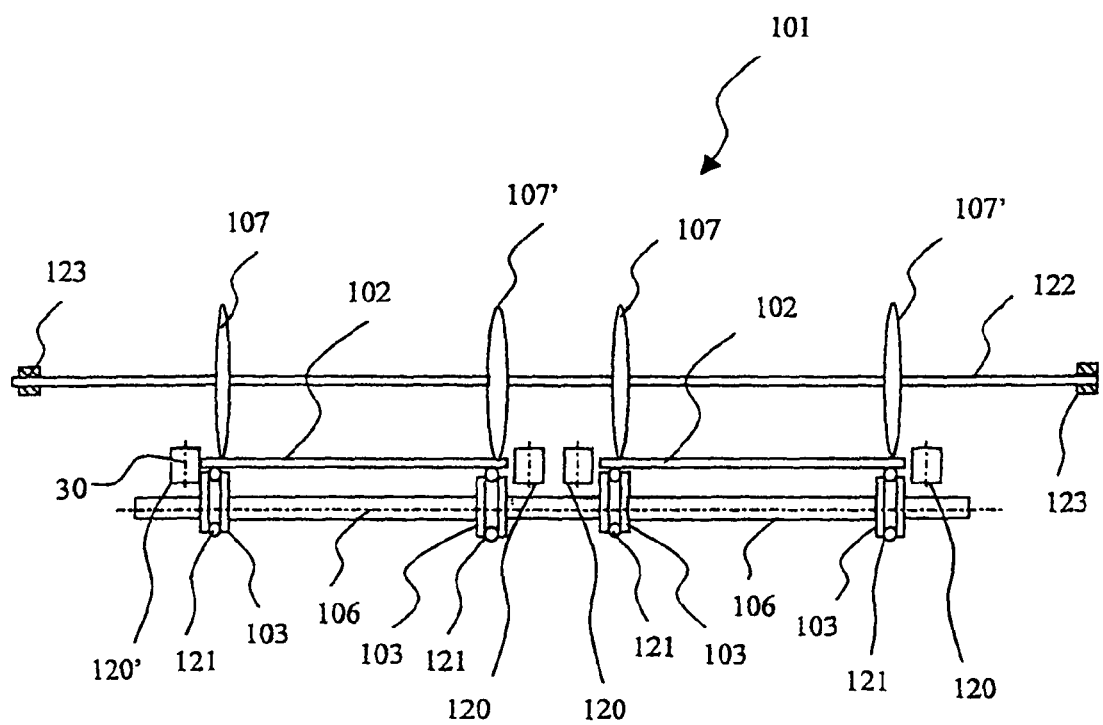
FIG. 3 shows a vertical section through an apparatus according to FIG. 1, provided with cylindrical lateral guide rollers and with a second embodiment of a counterholding device, perpendicularly to the drawing plane of FIG. 1.

As can be seen in particular from FIGS. 2 and 3, the plant 1 has two parallel "tracks", in which silicon substrates 2, in each case next to one another, can be guided through the treatment liquid 14. Each of these tracks has a plurality of transport rollers 3, which are connected together in pairs opposite one another and within the pair by a spindle 6. Lateral guide rollers 20, which are of a cylindrical shape, are located laterally outside of the transport rollers 3. The substrates 2 lie with their underside on the transport rollers 3 at the edge. The transport rollers 3 are provided with O-rings 21, which improve the friction, in their circumferential surfaces.

FIG. 2 also shows that a set of mating rollers 7 is in each case associated with each "track" of the plant 1. The mating rollers 7, which are located at the same "height" in the transport direction 4, of the different tracks are mounted on a common shaft 22, namely in an axial position such that they can in each case roll approximately in the centre between the two transport rollers 3 on the top side of the silicon substrates. The shaft 22 is mounted on both sides in bearings 23. It serves not only to hold the mating rollers 7, but also to supply current to these.

The shaft 22 is flexible through the choice of its material and through the choice of its geometry. This means that the shaft 22 can deflect even under small forces. As a result of this, the vertical position of two mating rollers 7 lying on the same shaft 22, as represented in FIG. 2, does not need to be the same.

If, for example, the top side of the silicon substrate 2 which is represented on the right-hand side in FIG. 2 is slightly higher than the top side of the silicon substrate 2 which is represented on the left-hand side, the mating roller 7 which is represented on the right-hand side can deflect upwards, with a certain elastic deformation of the shaft 22, while the mating roller 7 which is represented on the left-hand side remains in contact with the top side of the associated silicon substrate 2. It is in this way possible to guide the silicon substrates 2 carefully through the treatment liquid 14 even if they differ from one another geometrically, so that there is no possibility of the silicon substrates 2 fracturing. A range between approximately 1 and approximately 4 mm is possible for the diameter of the shaft 22 if it is made of metal, in particular special steel.

The cylindrical lateral guide rollers 20 are formed for guiding the substrates 2 conveyed on the transport rollers 3. Axes of rotation 30 of the lateral guide rollers 20 are oriented orthogonally to an axis of rotation of the spindle 6 and orthogonally to the conveying direction 4 directed into the drawing plane in FIG. 2. The level 16 of the treatment liquid is oriented substantially horizontally, while the axes of rotation 30 are oriented substantially parallel to a surface normal to the level 16. The lateral guide rollers 20 are in each case disposed in pairs opposite one another and therefore permit simultaneous action on the outer edges of the substrates 2. Rows of lateral guide rollers 20 are in each case provided on both sides of the substrates 2 in the conveying direction 4, these preferably extending over the entire length of the treatment chamber.

A spacing, i.e. a distance, between lateral guide rollers 20 disposed one behind the other in the conveying direction is preferably selected so as to be smaller than the length of the outer edges of the substrates 2 which come into contact with the lateral guide rollers 20. The spacing of the lateral guide rollers 20 is preferably selected so that it is less than 50 percent, preferably less than 30 percent, of a length of the outer edges which come into contact with the lateral guide rollers 20.

In FIG. 3 a further embodiment of the invention is represented in a section which corresponds to that of FIG. 2. The two embodiments are very similar; therefore corresponding components in FIG. 3 are marked with the same reference characters as in FIG. 2, plus 100. The sole difference lies in the fact that not just one (central mating roller) is provided, as in the embodiment of FIG. 2, for each "track", but rather two mating rollers 107, 107', which roll on the silicon substrates 102 at the edge, are provided on the same shaft 122. This embodiment is used in the case of silicon substrates 102 of larger dimensions and as a result prevents bending in the central region thereof.

Figure 4:
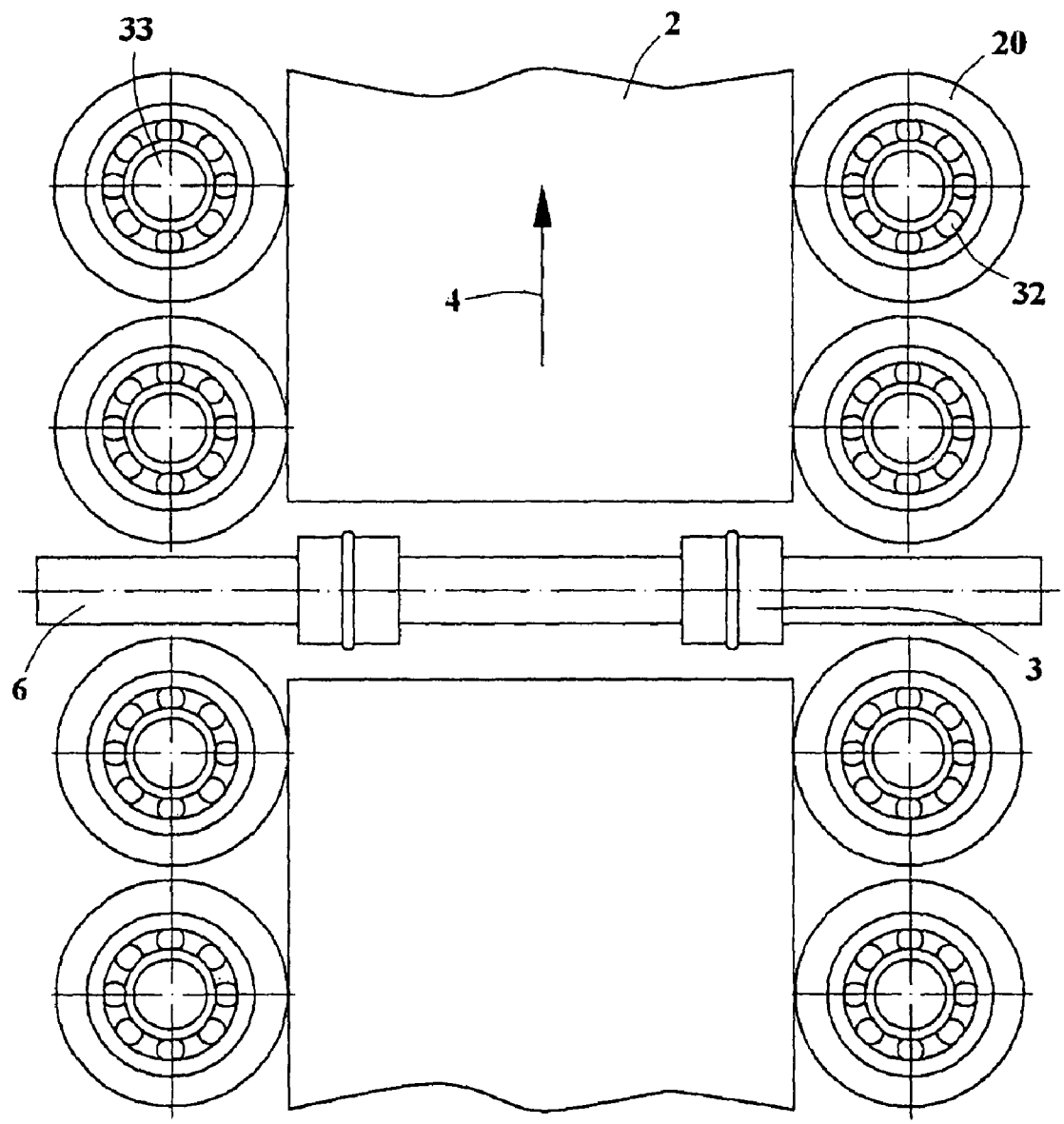
FIG. 4 shows a detail of the apparatus according to FIG. 2 or 3, without representing the counterholding device, in a plan view.

The plan view which is represented in FIG. 4 shows the arrangement of the lateral guide rollers 20 in relation to the size of the substrates 6, which are only partly represented in section. A spacing between the lateral guide rollers 20 is selected such that it is only a small fraction of a length of the outer edge of the substrate 6, so that tipping of the substrate 6 when conveyed by the transport rollers 3, which are fitted to the spindles 2, can be almost entirely excluded. The lateral guide rollers 20 are in each case fitted by way of schematically represented ball bearings 32 to stationary journals 33 associated with the transport device. The lateral guide rollers 20 are in each case disposed in rows, with the rows in each case being oriented parallel to the conveying direction 4. The lateral guide rollers 20 are in addition in each case disposed in pairs opposite one another, i.e. a connecting line between opposite lateral guide rollers 20 intersects the conveying direction 4 at a right angle. It is thereby possible to guarantee that, by way of its two outer edges pointing away from one another, the substrate 6 comes into contact, in each case simultaneously, with the respective lateral guide rollers 20, so that tipping or tilting of the substrate 6 can be almost entirely excluded.

In an embodiment which is not represented the journals are inclined at an acute angle of less than 5 degrees, preferably less than 3 degrees, in the conveying direction such that a slight drive force is exerted on the substrates. In another embodiment of the invention which is not represented the journals are oriented at an acute angle to the conveying plane in order optionally to permit a drive force and self-centring of the substrates.

In a further embodiment which is not represented lateral guide rollers are disposed in a rotationally rigid manner on rotating spindles which are driven in synchronism with the spindles of the transport rollers.

It is again emphasized that the above-described embodiments of the present invention, particularly, any "preferred" embodiments, are possible examples of implementations merely set forth for a clear understanding of the principles of the invention. Many variations and modifications may be made to the above-described embodiments of the invention without substantially departing from the spirit and principles of the invention. All such modifications are intended to be included herein within the spirit of the invention and the scope of protection is only limited by the accompanying claims.

The invention claimed is:

1. An electroplating apparatus for treating flat, brittle substrates, the apparatus comprising:
    a treatment chamber, in which the substrates can be acted upon by a treatment liquid;
    a transport device, by means of which the substrates can be guided so as to pass horizontally through the treatment chamber;
    at least one lateral guide device which acts on outer edges of the substrates, wherein the outer edges of the substrate are oriented substantially parallel to the conveying direction; and,
    at least one counterholding device which acts on upward pointing sides of the substrates to prevent the latter from lifting off the transport device, wherein the at least one counterholding devices comprises mating rollers which serve as contact devices for electrically contacting the substrates to be treated, wherein the mating rollers are mounted on a flexible shaft being capable of deflecting even under small forces;
    wherein the lateral guide device comprises cylindrical, rotatably mounted lateral guide rollers.

2. The electroplating apparatus of claim 1, wherein axes of rotation of the lateral guide rollers are oriented at least substantially normal to a conveying plane determined by transport rollers.

3. The electroplating apparatus of claim 1, wherein the lateral guide rollers are fitted in a rotatably mobile manner to journals by means of rolling contact bearings.

4. The electroplating apparatus of claim 3, wherein the rolling contact bearings are composed of at least one plastics material which is resistant with respect to the treatment liquid.

5. The electroplating apparatus of claim 1, wherein the lateral guide device extends completely over an entire transport path of the substrates in the treatment chamber, and/or the lateral guide rollers are in each case disposed in pairs opposite one another in rows along the conveying direction.

6. The electroplating apparatus of claim 1, wherein the substrates are guided through the treatment chamber in a plurality of tracks which are parallel to one another.

7. The electroplating apparatus of claim 2, wherein the lateral guide rollers are oriented at least substantially normal to a level of the treatment liquid.

8. The electroplating apparatus of claim 3, wherein the rolling contact bearings are ball bearings.

9. The electroplating apparatus of claim 2, wherein the lateral guide rollers are fitted in a rotatably mobile manner to journals by means of rolling contact bearings.

10. The electroplating apparatus of claim 9, wherein the rolling contact bearings are composed of at least one plastics material which is resistant with respect to the treatment liquid.

11. The electroplating apparatus of claim 9, wherein the lateral guide device extends completely over an entire transport path of the substrates in the treatment chamber, and/or the lateral guide rollers are in each case disposed in pairs opposite one another in rows along the conveying direction.

12. The electroplating apparatus of claim 9, wherein at least one counterholding device is provided which acts on the upward pointing side of the substrates to prevent the latter from lifting off the transport device.

13. The electroplating apparatus of claim 9, wherein the substrates are guided through the treatment chamber in a plurality of tracks which are parallel to one another.

14. The electroplating apparatus of claim 4, wherein the at least one plastics material is inert.

15. The electroplating apparatus of claim 2, wherein the lateral guide device extends completely over an entire transport path of the substrates in the treatment chamber, and/or the lateral guide rollers are in each case disposed in pairs opposite one another in rows along the conveying direction.

16. The electroplating apparatus of claim 2, wherein the substrates are guided through the treatment chamber in a plurality of tracks which are parallel to one another.

* * * * *